United States Patent
Sung et al.

(10) Patent No.: US 10,847,583 B2
(45) Date of Patent: Nov. 24, 2020

(54) ORGANIC LIGHT EMITTING DEVICE, METHOD OF MANUFACTURING THE SAME, AND SHADOW MASK THEREFOR

(71) Applicant: Samsung Display Co., Ltd., Yongin-si (KR)

(72) Inventors: Un-Cheol Sung, Anyang-si (KR); Beohm-Rock Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 261 days.

(21) Appl. No.: 15/071,816

(22) Filed: Mar. 16, 2016

(65) Prior Publication Data

US 2016/0197123 A1 Jul. 7, 2016

Related U.S. Application Data

(60) Continuation of application No. 13/557,170, filed on Jul. 24, 2012, now Pat. No. 9,318,537, which is a division of application No. 12/416,501, filed on Apr. 1, 2009, now Pat. No. 8,253,323.

(30) Foreign Application Priority Data

Jun. 27, 2008 (KR) .......................... 10-2008-0061571

(51) Int. Cl.
   *H01L 27/32* (2006.01)
   *H01L 51/52* (2006.01)

(52) U.S. Cl.
   CPC ...... *H01L 27/3211* (2013.01); *H01L 51/5203* (2013.01); *H01L 51/5265* (2013.01); *H01L 27/3276* (2013.01); *H01L 2251/558* (2013.01)

(58) Field of Classification Search
   CPC ....................... H01L 27/3216; H01L 27/3218
   See application file for complete search history.

(56) References Cited

U.S. PATENT DOCUMENTS

| | | | |
|---|---|---|---|
| 6,501,227 B1 | 12/2002 | Koyama | |
| 6,933,534 B1* | 8/2005 | Steffensmeier | G09F 9/33 257/10 |
| 7,365,488 B2* | 4/2008 | Lee | H01L 27/3211 257/40 |
| 2004/0036421 A1* | 2/2004 | Arnold | G09G 3/3216 315/169.3 |

(Continued)

FOREIGN PATENT DOCUMENTS

| | | |
|---|---|---|
| JP | 2003-142277 | 5/2003 |
| JP | 2005-209421 | 8/2005 |

(Continued)

OTHER PUBLICATIONS

Non-Final Office Action issued for related U.S. Appl. No. 12/416,501 dated Mar. 29, 2012.

(Continued)

*Primary Examiner* — Alex A Rolland

(74) *Attorney, Agent, or Firm* — H.C. Park & Associates, PLC

(57) ABSTRACT

An organic light emitting device including a blue subpixel that is larger than a red subpixel and a green subpixel. The red subpixel and the green subpixel have the same layered structure such that the red subpixel and the green subpixel are formed by using the same shadow mask.

14 Claims, 16 Drawing Sheets

(56) References Cited

U.S. PATENT DOCUMENTS

| | | |
|---|---|---|
| 2005/0242712 A1 | 11/2005 | Sung |
| 2008/0001525 A1 * | 1/2008 | Chao .................. H01L 27/3218 |
| | | 313/500 |
| 2008/0203898 A1 | 8/2008 | Kobayashi |

FOREIGN PATENT DOCUMENTS

| | | |
|---|---|---|
| JP | 2006-120473 | 5/2006 |
| JP | 2006-253015 | 9/2006 |
| JP | 2007-026852 | 2/2007 |
| JP | 2007-035580 | 2/2007 |
| JP | 2007-220577 | 8/2007 |
| KR | 1020040094119 | 11/2004 |
| KR | 1020040094628 | 11/2004 |
| KR | 10-0497094 | 6/2005 |
| KR | 1020050068234 | 7/2005 |
| KR | 10-2006-0040260 | 5/2006 |
| KR | 10-0635056 | 10/2006 |
| KR | 10-0787454 | 12/2007 |
| KR | 100787454 B1 * | 12/2007 |
| WO | 0215292 | 2/2002 |

OTHER PUBLICATIONS

Notice of Allowance issued for related U.S. Appl. No. 12/416,501 dated Jun. 19, 2012.
Non-Final Office Action issued for related U.S. Appl. No. 13/557,170 dated Jul. 13, 2015.
Notice of Allowance issued for related U.S. Appl. No. 13/557,170 dated Dec. 16, 2015.
Corrected Notice of Allowance issued for related U.S. Appl. No. 13/557,170 dated Dec. 31, 2015.

* cited by examiner

ORGANIC LIGHT EMITTING DEVICE, METHOD OF MANUFACTURING THE SAME, AND SHADOW MASK THEREFOR

CROSS REFERENCE TO RELATED APPLICATION

This application is a continuation of U.S. patent application Ser. No. 13/557,170, filed on Jul. 24, 2012, which is a divisional of U.S. patent application Ser. No. 12/416,501, filed on Apr. 1, 2009, now U.S. Pat. No. 8,253,323 and claims priority from and the benefit of Korean Patent Application No. 10-2008-0061571, filed on Jun. 27, 2008, all of which are hereby incorporated by reference for all purposes as if fully set forth herein.

BACKGROUND OF THE INVENTION

Field of the Invention

The present invention relates to an organic light emitting device, a manufacturing method thereof, and a shadow mask thereof.

Discussion of the Background

An organic light emitting device includes a plurality of pixels, and each pixel includes an organic light emitting element and a plurality of thin film transistors for driving them.

The organic light emitting element includes an anode, a cathode, and an organic light emitting member disposed therebetween. The organic light emitting member may emit light of three primary colors, for example, red, green, and blue. The materials that make up the organic light emitting member may be different according to the colors emitted from the organic light emitting member, and because the different materials are used, processes for manufacturing them may be additionally executed. As a result, the manufacturing process may be lengthened and the number of manufacturing process may be increased.

Also, a predetermined distance as a process margin may be required due to the masks used for forming the organic light emitting members of each color such that the aperture ratio is reduced.

SUMMARY OF THE INVENTION

The present invention provides an organic light emitting device that has an increased aperture ratio. The present invention also provides a method of manufacturing an organic light emitting device that reduces the number of manufacturing processes thereof, thereby reducing the manufacturing time and the manufacturing cost of the organic light emitting device.

Additional features of the invention will be set forth in the description which follows, and in part will be apparent from the description, or may be learned by practice of the invention.

The present invention discloses an organic light emitting device that includes: a red subpixel including a pixel electrode, a common electrode, and a red organic light emitting member; a green subpixel including a pixel electrode, a common electrode, and a green organic light emitting member; and a blue subpixel including a pixel electrode, a common electrode, and a blue organic light emitting member, the blue subpixel having a larger size than the red subpixel, and the blue subpixel having a larger size than the green subpixel, wherein the red organic light emitting member and the green organic light emitting member have the same layered structure.

The present invention also discloses an organic light emitting device including: a red subpixel including a pixel electrode, a common electrode, and a red organic light emitting member; a green subpixel including a pixel electrode, a common electrode, and a green organic light emitting member; and a blue subpixel including a pixel electrode, a common electrode, and a blue organic light emitting member, the blue subpixel having a larger size than the red subpixel, and the blue subpixel having a larger size than the green subpixel. The red organic light emitting member and the green organic light emitting member have the same layered structure. One red subpixel, one green subpixel, and one blue subpixel form a unit pixel. The unit pixel includes the red subpixel and the green subpixel, which are alternately arranged according to a first column, and the blue subpixel, which is arranged according to a second column. A second unit pixel is symmetrical in left and right directions.

The present invention also discloses a manufacturing method of an organic light emitting device that includes forming a plurality of pixel electrodes on a substrate, forming a red organic light emitting member, a green organic light emitting member, and a blue organic light emitting member on the pixel electrode, and forming a common electrode on the organic light emitting member, wherein the red organic light emitting member and the green organic light emitting member are formed together with the same process.

The present invention also discloses a shadow mask that includes a main body and at least two openings formed in the main body and having the same shape, wherein a red emission layer, a green emission layer, and a blue emission layer are formed through the openings. The openings are arranged in row and column directions, and are arranged with a zigzag shape in one line in the column direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
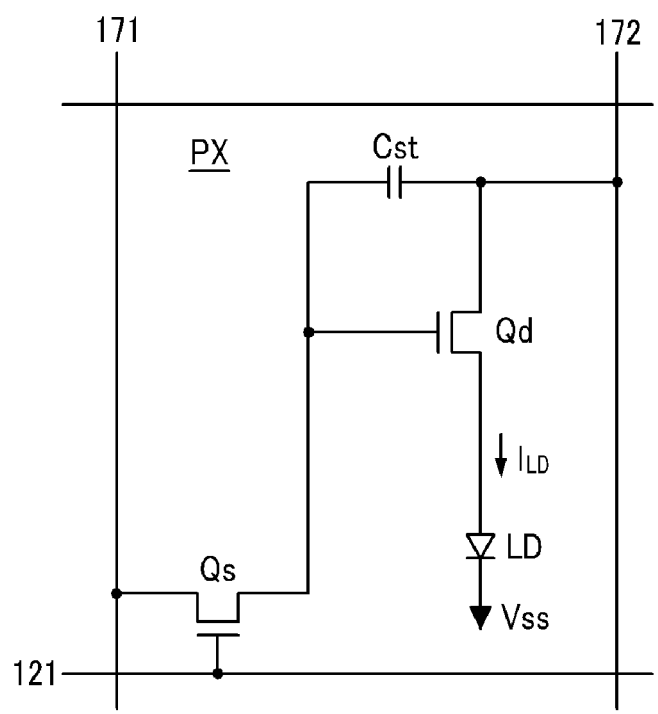
FIG. 1 is an equivalent circuit diagram of a unit subpixel in an organic light emitting device according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

An organic light emitting device according to an exemplary embodiment of the present invention will be described in detail with reference to FIG. 1.

FIG. 1 is an equivalent circuit diagram of a unit subpixel in an organic light emitting device according to an exemplary embodiment of the present invention.

Referring to FIG. 1, an organic light emitting device according to the present exemplary embodiment includes a plurality of signal lines 121, 171, and 172, and a plurality of unit subpixels PX connected thereto. The unit subpixels PX are not shown in FIG. 1, however they are arranged substantially in a matrix.

The signal lines include a plurality of gate lines 121 for transmitting gate signals (or scanning signals), a plurality of data lines 171 for transmitting data signals, and a plurality of driving voltage lines 172 for transmitting a driving voltage. The gate lines 121 extend substantially in a row direction and are substantially parallel to each other, and the data lines 171 extend substantially in a column direction and are substantially parallel to each other. The driving voltage lines 172 also extend substantially in a column direction and are substantially parallel to each other. Alternatively, the driving voltage 172 may extend in the row direction, or they may be formed with a mesh shape (i.e., extend in both the row direction and the column direction).

Each unit subpixel PX includes a switching transistor Qs, a driving transistor Qd, a storage capacitor Cst, and an organic light emitting element LD.

The switching transistor Qs has a control terminal connected to one of the gate lines 121, an input terminal connected to one of the data lines 171, and an output terminal connected to the driving transistor Qd. The switching transistor Qs transmits the data signals applied to the data line 171 to the driving transistor Qd in response to a gate signal applied to the gate line 121.

The driving transistor Qd has a control terminal connected to the switching transistor Qs, an input terminal connected to the driving voltage line 172, and an output terminal connected to the organic light emitting element LD. The driving transistor Qd drives an output current $I_{LD}$ having a magnitude depending on the voltage difference between the control terminal and the input terminal thereof.

The capacitor Cst is connected between the control terminal and the input terminal of the driving transistor Qd. The capacitor Cst stores a data signal applied to the control terminal of the driving transistor Qd and maintains the data signal after the switching transistor Qs turns off.

The organic light emitting element LD may be an organic light emitting diode (OLED) that has an anode connected to the output terminal of the driving transistor Qd and a cathode connected to a common voltage Vss. The organic light emitting element LD emits light having an intensity depending on an output current $I_{LD}$ of the driving transistor Qd, thereby displaying images.

The switching transistor Qs and the driving transistor Qd are shown as n-channel field effect transistors (FETs), however at least one of the switching transistor Qs and the driving transistor Qd may be a p-channel FET. In addition, the connections among the transistors Qs and Qd, the capacitor Cst, and the organic light emitting element LD may be modified. For example, different transistors for compensating the threshold voltage of the driving transistor Qd and the organic light emitting element LD may be added in addition to the switching transistor Qs and the driving transistor Qd.

The detailed structure of the organic light emitting device shown in FIG. 1 will be described below with reference to FIG. 2 and FIG. 3 as well as FIG. 1.

Figure 2:
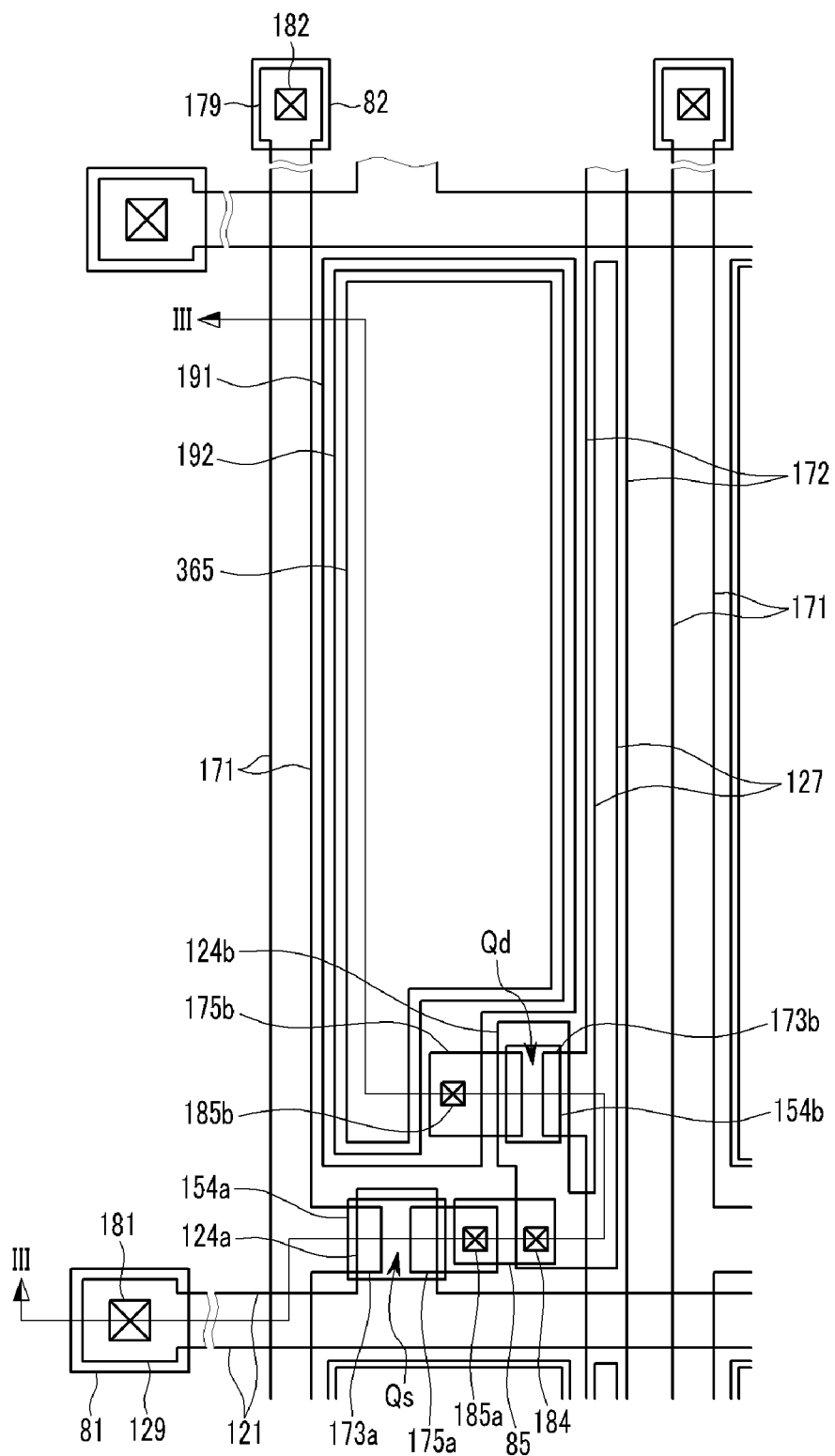
FIG. 2 is a layout view of a unit subpixel of an organic light emitting device according to an exemplary embodiment of the present invention.
Figure 3:
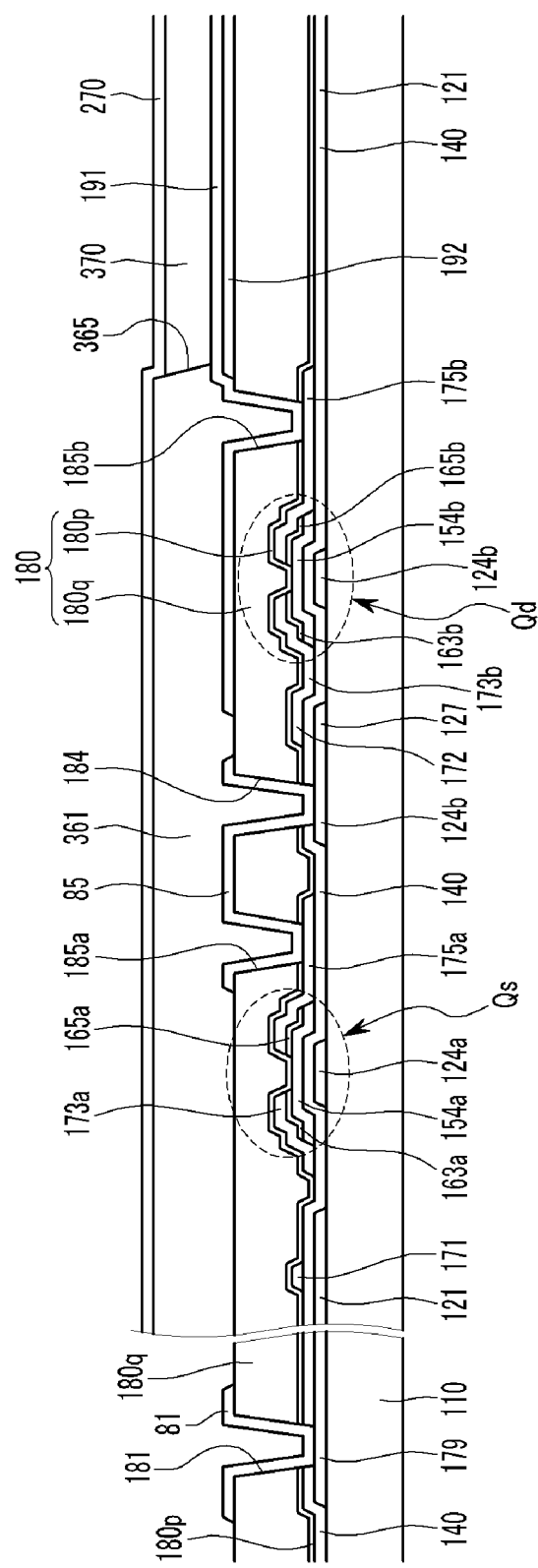
FIG. 3 is a cross-sectional view of the unit subpixel shown in FIG. 2 taken along line III-III.

FIG. 2 is a layout view of a unit subpixel of an organic light emitting device according to an exemplary embodiment of the present invention, and FIG. 3 is a cross-sectional view of the unit subpixel shown in FIG. 2, taken along line III-III.

Figure 4:
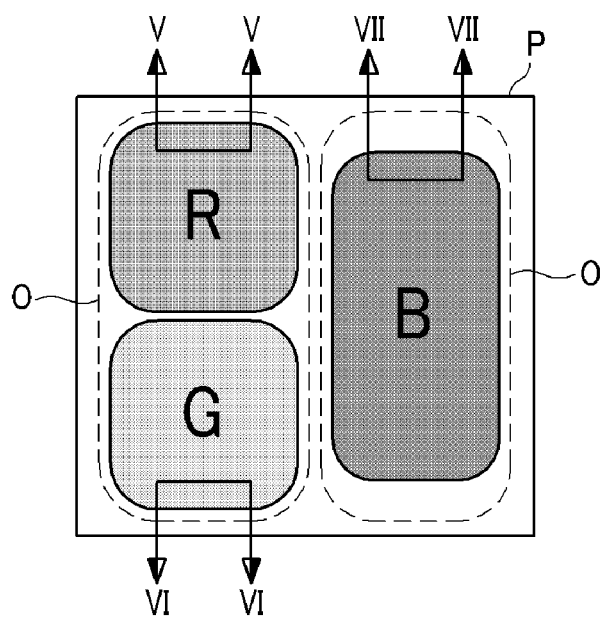
FIG. 4 is a schematic layout view of a unit pixel of an organic light emitting device according to an exemplary embodiment of the present invention.

Referring to FIG. 2, FIG. 3, and FIG. 4, a plurality of gate lines 121 including a plurality of first control electrodes 124a and a plurality of second control electrodes 124b are formed on an insulating substrate 110 made of a material such as transparent glass or plastic.

The gate lines 121 extend in the transverse direction, and the first control electrodes 124a protrude upward. Each gate line 121 includes an end portion 129 having a large area for contact with another layer or an external driving circuit.

The second control electrodes 124b are separated from the gate lines 121 and include a plurality of storage electrodes 127 extending in a longitudinal direction.

A gate insulating layer 140, which may be made of silicon oxide or silicon nitride, is formed on the gate lines 121 and the second control electrodes 124b.

A plurality of first and second semiconductor islands 154a and 154b, which may be made of hydrogenated amorphous silicon, are formed on the gate insulating layer 140. The first semiconductor islands 154a are disposed on the first control electrodes 124a and the second semiconductor islands 154b are disposed on the second control electrodes 124b.

A plurality of pairs of first ohmic contacts 163a and 165a are formed on the first semiconductor islands 154a, and a plurality of pairs of second ohmic contacts 163b and 165b are formed on the second semiconductor islands 154b. The ohmic contacts 163a, 163b, 165a, and 165b have an island shape, and may be made of a material such as n+ hydrogenated amorphous silicon that is heavily doped with an n-type impurity such as phosphorus.

A plurality of data lines 171, a plurality of driving voltage lines 172, and a plurality of first and second output electrodes 175a and 175b are formed on the ohmic contacts 163a, 163b, 165a, and 165b, and on the gate insulating layer 140.

The data lines 171 and the driving voltage lines 172 extend in the longitudinal direction while crossing the gate lines 121. The data lines 171 include first input electrodes 173a extending toward the first control electrodes 124a, and the driving voltage lines 172 include second input electrodes 173b extending toward the second control electrodes 124b.

The first and second output electrodes 175a and 175b are separated from each other, as are the data lines 171 and the driving voltage lines 172. The first input electrodes 173a and the first output electrodes 175a are opposite to each other with respect to the first control electrodes 124a, and the second input electrodes 173b and the second output electrodes 175b are opposite to each other with respect to the second control electrodes 124b.

The ohmic contacts 163a, 163b, 165a, and 165b are disposed between the semiconductor islands 154a and 154b thereunder and the overlaying data lines 171, the driving voltage lines 172, and the output electrodes 175a and 175b. The semiconductor islands 154a and 154b include a portion between the input electrodes 173a and 173b and the output electrodes 175a and 175b that is exposed by them and serves as a channel region.

The first control electrode 124a, the first input electrode 173a, and the first output electrode 175a form a switching thin film transistor (TFT) Qs along with the first semiconductor island 154a, and the second control electrode 124b, the second input electrode 173b, and the second output electrode 175b form a driving thin film transistor Qd along with the second semiconductor island 154b.

The structures of the above-described switching thin film transistor Qs, the driving thin film transistor Qd, the gate line 121, the data line 171, and the driving voltage line 172 are merely exemplary as they may have various structures.

A passivation layer 180 is formed on the data lines 171, the driving voltage lines 172, the output electrodes 175a and 175b, and the exposed semiconductor islands 154a and 154b. The passivation layer 180 includes a lower layer 180p that may be made of an inorganic insulator such as silicon nitride or silicon oxide, and an upper layer 180q that may be made of an organic insulator. The organic insulator may have a dielectric constant of less than 4.0, and it may have photosensitivity and a flat surface. Alternatively, the passivation layer 180 may have a single-layered structure as an inorganic insulator, or as an organic insulator.

The passivation layer 180 has a plurality of contact holes 182 exposing end portions 179 of the data lines 171, and a plurality of contact holes 185a and 185b exposing the output electrodes 175a and 175b. The passivation layer 180 and the gate insulating layer 140 have a plurality of contact holes 181 exposing the end portions 129 of the gate lines 121, and a plurality of contact holes 184 exposing the second control electrodes 124b.

A plurality of reflecting electrodes 192 are formed on the passivation layer 180. The reflecting electrodes 192 are made of a metal such as magnesium (Mg), aluminum (Al), silver (Ag), or a reflective material including an alloy thereof (for example, a magnesium/silver alloy).

A plurality of pixel electrodes 191, and a plurality of connecting members 85 and contact assistants 81 and 82, are respectively formed on the reflecting electrode 192 and the passivation layer 180. The pixel electrodes 191, the connecting members 85, and the contact assistants 81 and 82 may be made of a transparent conductive material such as ITO or IZO.

The pixel electrodes 191 are connected to the second output electrodes 175b through the contact holes 185b, and the connecting members 85 are connected to the second control electrodes 124b and the first output electrodes 175a through the contact holes 184 and 185a, respectively.

The contact assistants 81 and 82 are respectively connected to the end portions 129 and 179 of the gate and data lines 121 and 171 through the contact holes 181 and 182. The contact assistants 81 and 82 respectively enhance adhesion between the end portions 129 and 179 of the gate lines 121 and the data lines 171 and external devices, and protect them.

Partitions 361 are formed on the passivation layer 180. The partitions 361 define a plurality of openings 365 enclosing edges of the pixel electrodes 191 like a bank, and are made of an organic insulator or an inorganic insulator. Each partition 361 may be made of a photosensitive material including a black pigment, and because the partition 361 functions as a light blocking member, the manufacturing process may be simplified.

A plurality of organic light emitting members 370 are formed in the openings 365 defined by the partitions 361 on the pixel electrodes 191.

Figure 5:
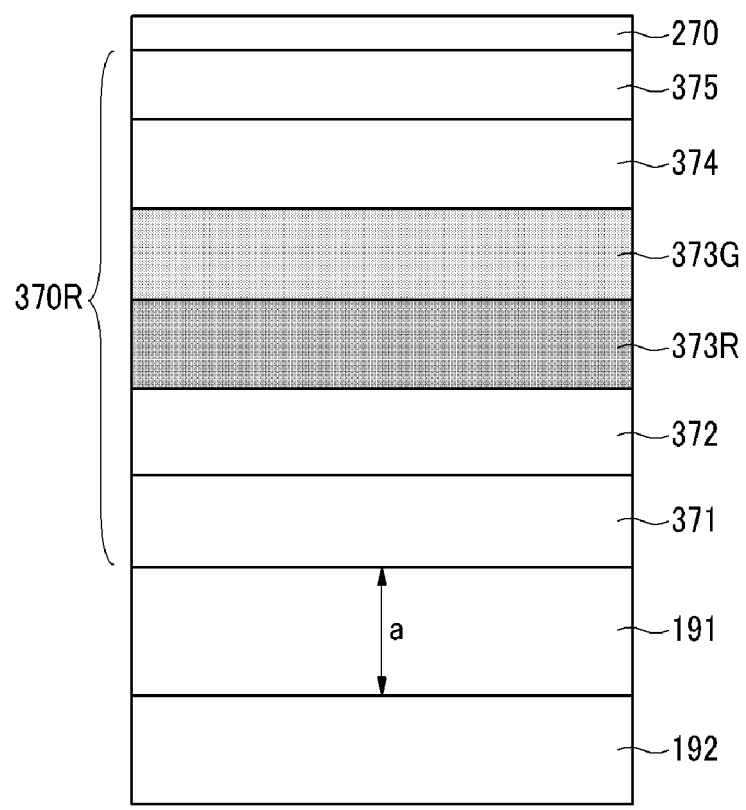
FIG. 5 is a cross-sectional view of an electrode and an organic light emitting member of a red subpixel according to an exemplary embodiment of the present invention.

The organic light emitting members 370 may be made of a multi-layered structure in which a hole injection layer 371, a hole transport layer 372, an emission layer 373, an electron transport layer 374, and an electron injection layer 375 are sequentially deposited (see FIG. 5). The emission layer 373 is preferably made of an organic material uniquely emitting light of one primary color such as red, green, or blue, and the remaining layers except for the emission layer 373 enhance the light emitting efficiency of the emission layer 373. The emission layer 373 may have various layered structures for each color, and will be described below.

A common electrode 270 is formed on the organic light emitting member 370 and the partition 361 on the whole surface of the substrate. The common electrode 270 may be made of a reflective metal such as silver (Ag), magnesium (Mg), aluminum (Al), or an alloy thereof (for example, a magnesium/silver alloy), and the thickness thereof may be in the range of about 50 Å-200 Å. If the metal used in the common electrode 270 has a thickness in this range, the metal may have a translucent characteristic in which incident light is both reflected and transmitted.

In the organic light emitting device, the pixel electrode 191, the organic light emitting member 370, and the common electrode 270 form an organic light emitting element LD.

The organic light emitting device according to an exemplary embodiment of the present invention emits light toward the upper side of the substrate 110 to display images.

The light emitted from the organic light emitting member 370 to the common electrode 270 is reflected by the common electrode 270, guided toward the pixel electrode 191, passes through the pixel electrode 191, and arrives at the reflecting electrode 192. The reflecting electrode 192 again reflects the incident light toward the common electrode 270, and the common electrode 270 reflects the light to emit the light to the reflecting electrode 192. In this way, the light reciprocating between the reflecting electrode 192 and the common electrode 270 is subjected to an optical process such as interference until it passes through the common electrode 270 to the outside if appropriate conditions are imposed. If the distance between the common electrode 270 and the reflecting electrode 192, that is, the total thickness of the pixel electrode 191 and the organic light emitting member 370, has the value of an integer multiple of the particular wavelength of emitted light, the light of the particular wavelength is emitted outside. Therefore, the total thickness of the pixel electrode 191 and the organic light emitting member 370 may be controlled to thereby control the wavelength of the emitted light. This is called a micro-cavity characteristic.

By using the micro-cavity characteristic, even though the red subpixel and the green subpixel have the same layered structure in the present invention, light having different wavelengths may be emitted.

In the organic light emitting device according to an exemplary embodiment of the present invention, the cross-sectional structure of each color subpixel will now be described. The differences between the subpixels of each color will be specifically described below.

Figure 6:
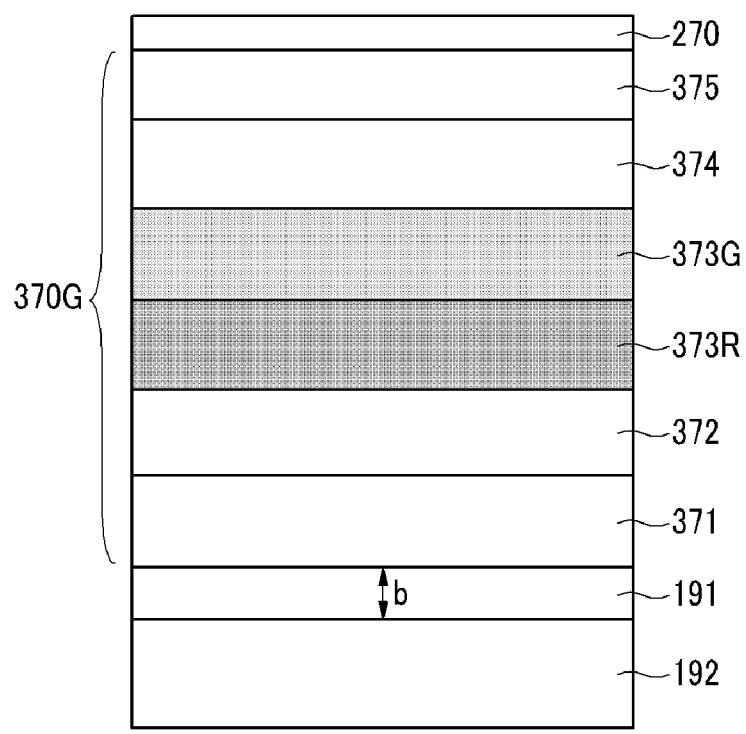
FIG. 6 is a cross-sectional view of an electrode and an organic light emitting member of a green subpixel according to an exemplary embodiment of the present invention.
Figure 7:
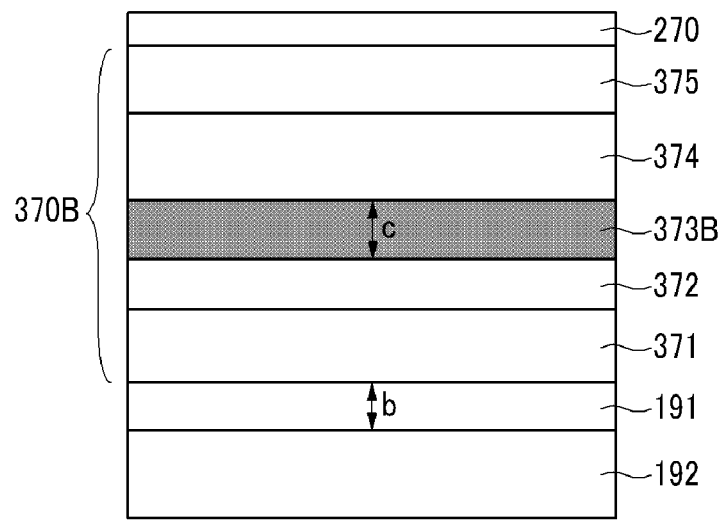
FIG. 7 and FIG. 8 are cross-sectional views of an electrode and an organic light emitting member of a blue subpixel according to an exemplary embodiment of the present invention.
Figure 8:
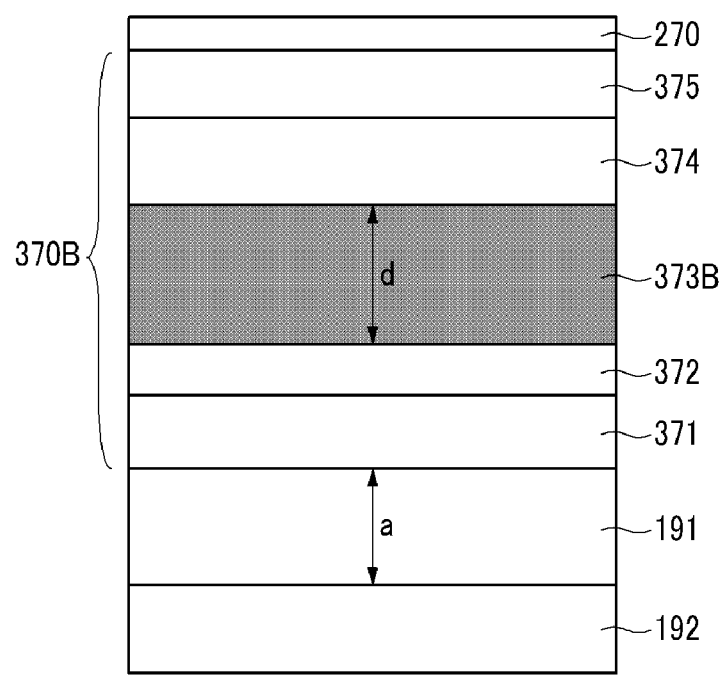

FIG. 4 is a schematic layout view of a unit pixel of an organic light emitting device according to an exemplary embodiment of the present invention, FIG. 5 is a cross-sectional view of an electrode and an organic light emitting member of a red subpixel according to an exemplary embodiment of the present invention, FIG. 6 is a cross-sectional view of an electrode and an organic light emitting member of a green subpixel according to an exemplary embodiment of the present invention, and FIG. 7 and FIG. 8 are cross-sectional views of an electrode and an organic light emitting member of a blue subpixel according to an exemplary embodiment of the present invention.

FIG. 4 shows the arrangement of the unit pixel P in the organic light emitting device according to an exemplary embodiment of the present invention. Each subpixel is schematically shown in FIG. 4, wherein R indicates a red subpixel, G indicates a green subpixel, B indicates a blue subpixel, and O indicates an opening of a shadow mask. Hereafter, R, G, B, and O all indicate the same elements in subsequent figures.

The red subpixel R and the green subpixel G have the same size, and form the left column of the unit pixel P. The blue subpixel B forms the right column of the unit pixel P. The blue subpixel B may have the same width as the red subpixel R and the green subpixel G, and its length may be 1.5 to 2 times its width.

The size of the red subpixel R together with the green subpixel G, and the blue subpixel B, are different. However, they all include the unit structure as shown in FIG. 1, FIG. 2, and FIG. 3. Also, the blue subpixel B according to an exemplary embodiment of the present invention may have a structure in which two subpixels having the same size as the red subpixel R or the green subpixel G are connected to each other.

The cross-section of the electrode and the organic light emitting member in each subpixel will be described with reference to FIG. 5, FIG. 6, FIG. 7, and FIG. 8.

FIG. 5 represents the cross-sectional view of the electrode and the organic light emitting member in the red subpixel R. A reflecting electrode 192, a pixel electrode 191, a hole injection layer 371, a hole transport layer 372, a red emission layer 373R, a green emission layer 373G, an electron transport layer 374, an electron injection layer 375, and a common electrode 270 are sequentially deposited. The hole injection layer 371, the hole transport layer 372, the red emission layer 373R, the green emission layer 373G, the electron transport layer 374, and the electron injection layer 375 form a red organic light emitting member 370R.

In the green subpixel G shown in FIG. 6, a reflecting electrode 192, a pixel electrode 191, a hole injection layer 371, a hole transport layer 372, a red emission layer 373R, a green emission layer 373G, an electron transport layer 374, an electron injection layer 375, and a common electrode 270 are sequentially deposited. Here, the hole injection layer 371, the hole transport layer 372, the red emission layer 373R, the green emission layer 373G, the electron transport layer 374, and the electron injection layer 375 form a green organic light emitting member 370G.

FIG. 5 and FIG. 6 have the same layered structure, however the thicknesses of the pixel electrodes 191 are different. That is, the pixel electrode 191 has the thickness "a" in the red subpixel R, and the pixel electrode 191 has the thickness "b" that is less than the thickness "a" in the green subpixel G.

Considering the micro-cavity characteristic, the thickness "a" of the pixel electrode 191 is controlled in the red subpixel R such that the light having a red wavelength is reflected between the reflecting electrode 192 and the common electrode 270 and is emitted outside. The thickness "b" of the pixel electrode 191 is controlled in the green subpixel G such that the light having a green wavelength is emitted. That is, the sum of the thicknesses of pixel electrode 191 and the red organic light emitting member 370R equals the integer multiple of the light having the red wavelength in the red subpixel R. Also, the sum of the thicknesses of the pixel electrode 191 and the green organic light emitting member 370G equals the integer multiple of the light having the green wavelength in the green subpixel G.

The red subpixel R and the green subpixel G have the same layered structure and the same thickness except for the thickness of the pixel electrode 191. Therefore, if the pixel electrode 191 is separately formed in the red subpixel R and the green subpixel G, the remaining structures may be simultaneously formed. Particularly, the emission layer 373 may be formed together by using the opening O of one shadow mask. As a result, the red emission layer 373R and the green emission layer 373G are present in the portion between the red subpixel R and the green subpixel G that are formed by the same opening O. The partition 361 only exists in this portion, and the pixel electrode 191 is not formed in the portion between the red subpixel R and the green subpixel G. Therefore the current does not flow in this portion of the unit pixel P, and as a result light is not emitted.

Also, when forming each emission layer 373 using a different shadow mask, a predetermined interval may be required due to a shadow effect (if the interval between the openings O of each shadow mask is narrow, the emission layers may be formed with a different shape from the opening O) between the red subpixel and the green subpixel, however the thickness of the partition 361 may be minimized, thereby improving the aperture ratio in the present invention in which the emission layer 373 is formed by using the same shadow mask.

Referring to FIG. 7 and FIG. 8, the blue subpixel B may be separately formed, and FIG. 7 and FIG. 8 show different exemplary embodiments of the blue subpixel.

FIG. 7 and FIG. 8 show the cross-section of the electrode and the organic light emitting member in the blue subpixel B. A reflecting electrode 192, a pixel electrode 191, a hole injection layer 371, a hole transport layer 372, a blue emission layer 373B, an electron transport layer 374, an electron injection layer 375, and a common electrode 270 are sequentially deposited in the blue subpixel B. The hole injection layer 371, the hole transport layer 372, the blue emission layer 373B, the electron transport layer 374, and the electron injection layer 375 form a blue organic light emitting member 370B.

As respectively shown in FIG. 7 and FIG. 8, the pixel electrode 191 of the blue subpixel B has the thickness "b" of the pixel electrode of the green subpixel G and the thickness "a" of the pixel electrode of the red subpixel R. That is, the pixel electrode 191 of the blue subpixel B may be formed together with a pixel electrode 191 of the red subpixel R or the green subpixel G.

The sum of the thickness of the pixel electrode 191 and the blue organic light emitting member 370B may be an integer multiple of the wavelength of the blue light in the blue subpixel B according to the characteristic of the micro-cavity. However, the thickness of the pixel electrode 191 of the blue subpixel B may be the same as that of the red subpixel R or the green subpixel G such that that the thickness of the blue emission layer 373B may be controlled to emit light of a blue wavelength. By controlling the thickness of the blue emission layer 373B, the common layers between the red, green, and blue subpixels R, G, and B may be formed together.

There are many conditions for satisfying the characteristics of the micro-cavity such that the thickness of the blue emission layer 373B may be greater or less than the thickness of the red emission layer 373R and the green emission layer 373G. That is, FIG. 7 shows the thickness "c" of the blue emission layer 373B as thinner than the thickness of the red emission layer 373R and the green emission layer 373G. FIG. 8 shows the thickness "d" of the blue emission layer 373B as thicker than the thickness of the red emission layer 373R and the green emission layer 373G.

Figure 9:
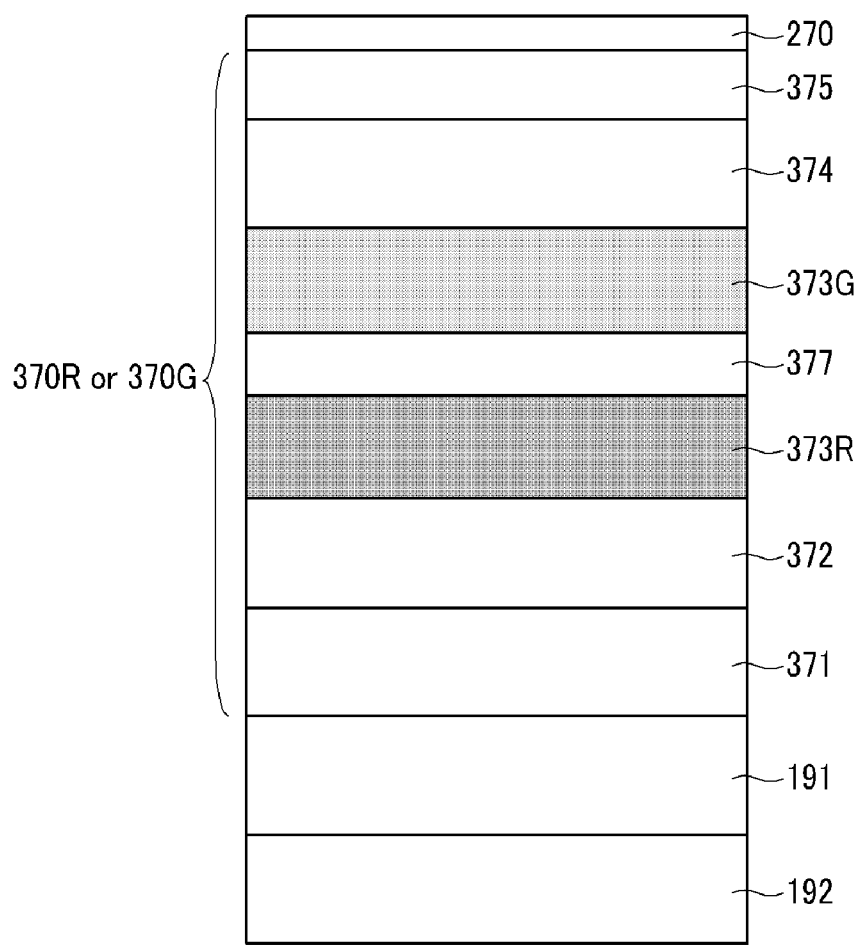
FIG. 9 is a cross-sectional view of an electrode and an organic light emitting member of a red subpixel or a green subpixel according to another exemplary embodiment of the present invention.

Alternatively, the pixel electrode 191 of the blue subpixel B and the layers of the blue emission layer 373B may have a different thickness from that of the layers of the red subpixel R or the green subpixel G. FIG. 9 is a cross-sectional view of an electrode and an organic light emitting member of a red subpixel or a green subpixel according to another exemplary embodiment of the present invention.

FIG. 9 shows another layered structure of the organic light emitting member 370 of a red subpixel R or a green subpixel G. That is, an interlayer 377 is formed between the red emission layer 373R and the green emission layer 373G such that the interference between the red emission layer 373R and the green emission layer 373G may be prevented, thereby improving the display characteristics. The interlayer 377 may be formed of the same material as the hole transport layer 372 or the electron transport layer 374.

The thickness between the reflecting electrode 192 and the common electrode 270 may satisfy the condition of the micro-cavity, to emit light of a red or a green wavelength. FIG. 10 to FIG. 13 are schematic layout views of a unit pixel of an organic light emitting device according to another exemplary embodiment of the present invention.

FIG. 10, FIG. 11, FIG. 12, and FIG. 13 show alternative structures (particularly, the size of the opening O) from the structure of the opening O of the shadow mask to form the emission layer 373 as shown in FIG. 4.

Figure 10:
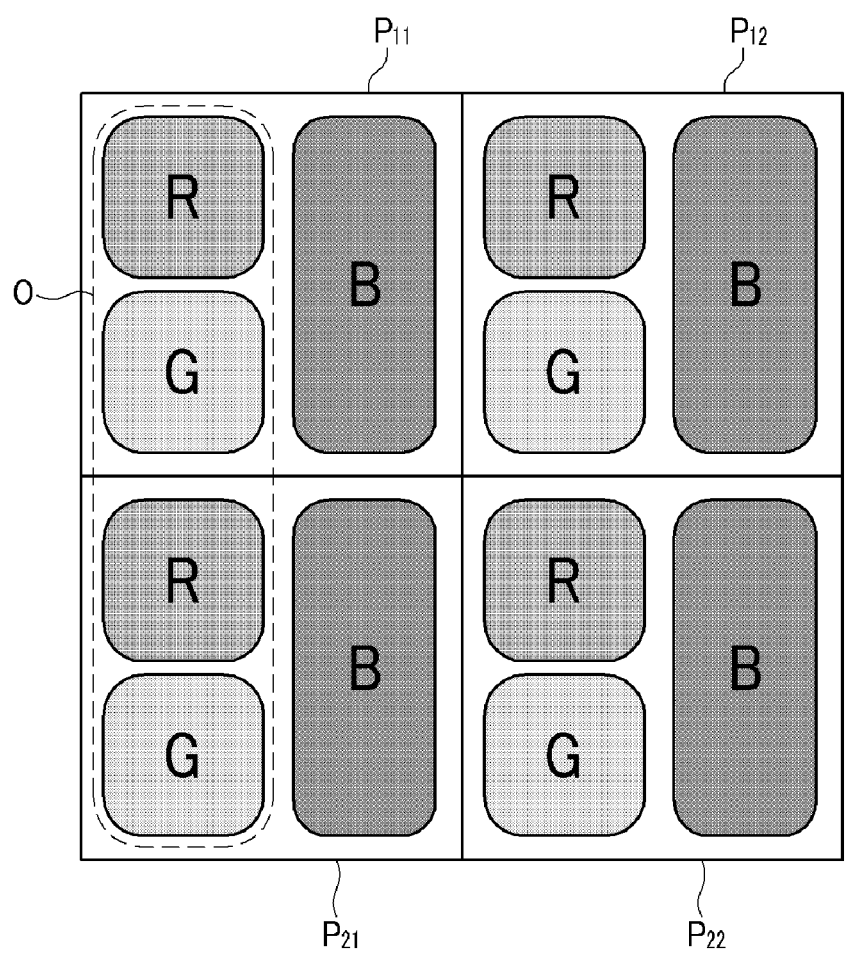
FIG. 10, FIG. 11, FIG. 12, and FIG. 13 are schematic layout views of a unit pixel of an organic light emitting device according to another exemplary embodiment of the present invention.

FIG. 10 has the same arrangement as the unit pixel shown in FIG. 4. In the exemplary embodiment shown in FIG. 4, the red emission layer 373R and the green emission layer 373G are formed together by using the one opening O of a shadow mask when forming the red subpixel R and the green subpixel G in one unit pixel. However, the red emission layer 373R and the green emission layer 373G are deposited in two unit pixels in FIG. 10. That is, the red emission layer 373R and the green emission layer 373G are deposited two by two for a total of four subpixels (two red subpixels R and two green subpixels G) in the upper and lower pixels $P_{11}$ and $P_{21}$, respectively, in FIG. 10. In the case of the blue subpixel B of FIG. 4, one blue emission layer 373B is formed by one opening O of the shadow mask. However in FIG. 10, blue emission layers 373B of two blue subpixels B are formed by one opening O of the shadow mask. In FIG. 10, the opening O of the shadow mask used for forming the red emission layer 373R and the green emission layer 373G is the same as the opening O of the shadow mask for forming the blue emission layer 373B.

Figure 11:
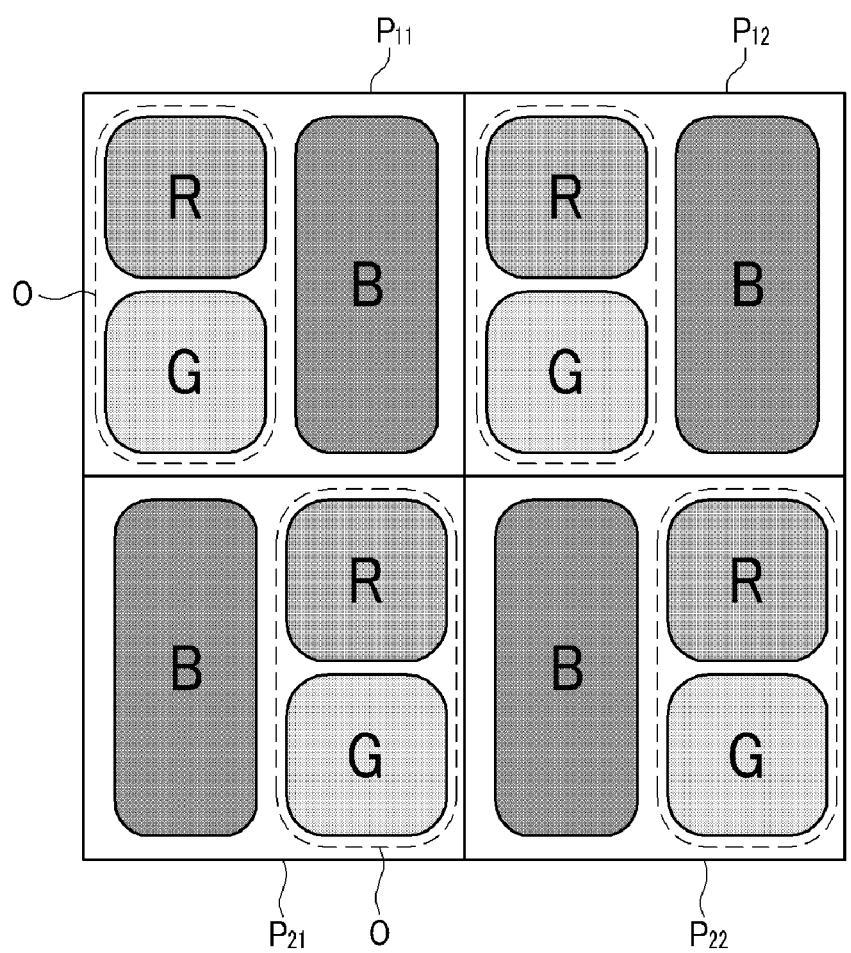

In the exemplary embodiment shown in FIG. 11, the red emission layer 373R and the green emission layer 373G in the unit pixel are deposited through the one opening O of a shadow mask, as in FIG. 4. However, in FIG. 11, the structure of the unit pixel of FIG. 4 and the right and left symmetrical structures thereof (i.e., the blue subpixel B is disposed in the left side, and the red subpixel R and the green subpixel G are disposed in the right side; hereafter, referred to as "a unit pixel of right and left symmetry") are arranged together. That is, the unit pixels of FIG. 4 are arranged in one row, the unit pixels of right and left symmetry are arranged in the next row, and the unit pixels are changed every row. The blue emission layer 373B is formed on the unit pixel by one opening O of the shadow mask as in FIG. 4, which is the same opening O of the shadow mask for forming the red emission layer 373R and the green emission layer 373G.

Figure 12:
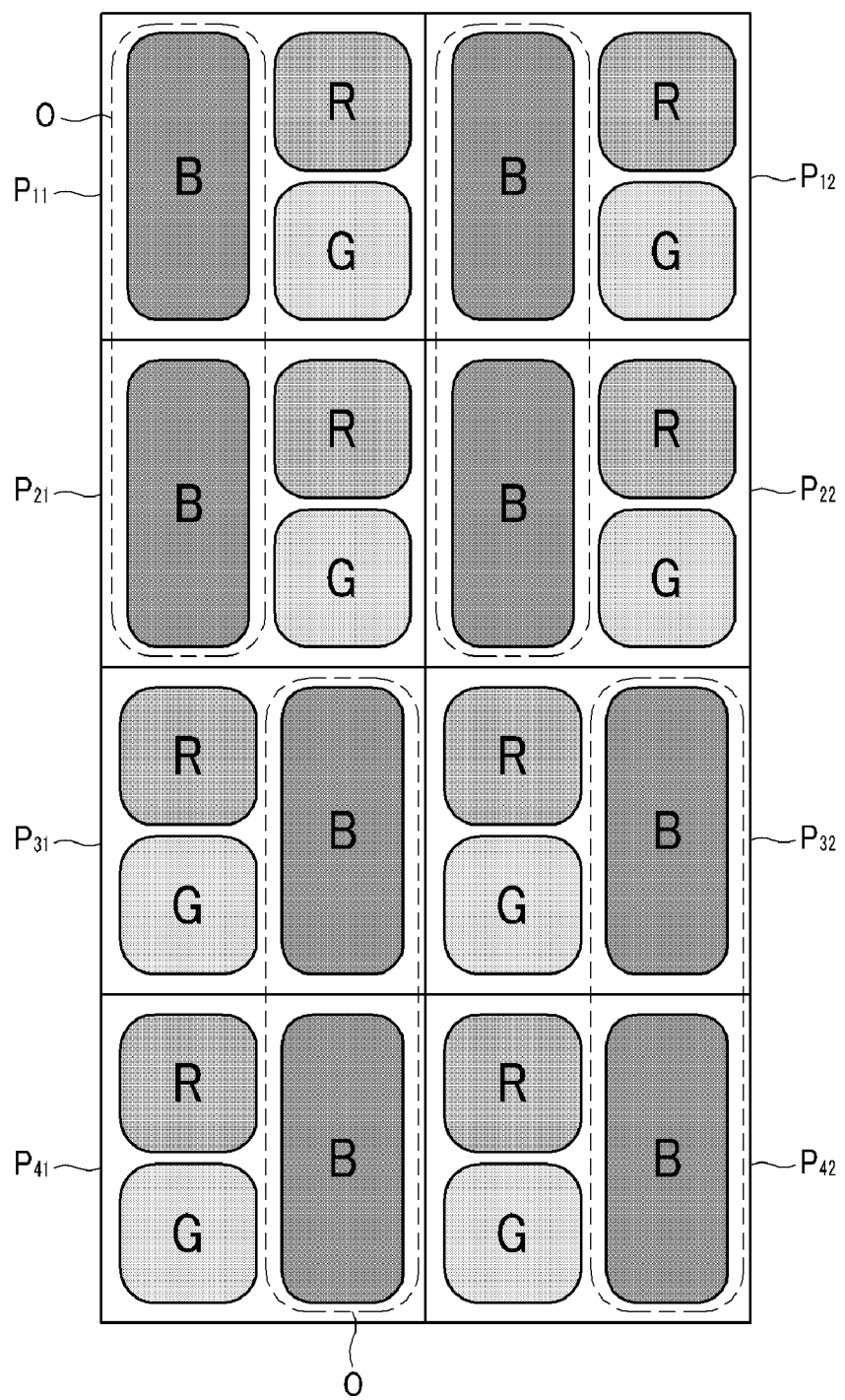

The exemplary embodiment shown in FIG. 12 has a structure in which the unit pixel of the exemplary embodiment shown in FIG. 11 is changed by two rows as a unit. Also, an emission layer 373 is formed on two unit pixels that are close to each other in the upper and lower sides. That is, the red emission layer 373R and the green emission layer 373G in the pixel $P_{11}$ and the pixel $P_{21}$ are formed by one opening O of a shadow mask, and the blue emission layer 373B in the pixel $P_{11}$ and the pixel $P_{21}$ is formed by one opening O of the shadow mask. The opening O of the shadow mask for forming the blue emission layer 373B is the same opening O of the shadow mask for forming the red emission layer 373R and the green emission layer 373G.

Considering the shadow effects, the exemplary embodiment shown in FIG. 12 includes a smaller region where the shadow effect may occur as compared with the exemplary embodiment shown in FIG. 11. That is, the shadow effect may occur between the pixel $P_{11}$ and the pixel $P_{21}$ in FIG. 11 such that the interval between the pixels must be relatively far, however in FIG. 12, the pixel $P_{11}$ and the pixel $P_{21}$ are formed by one opening O of the shadow mask such that the maximum wide region may be used without considering the shadow effect, thereby improving the aperture ratio.

Figure 13:
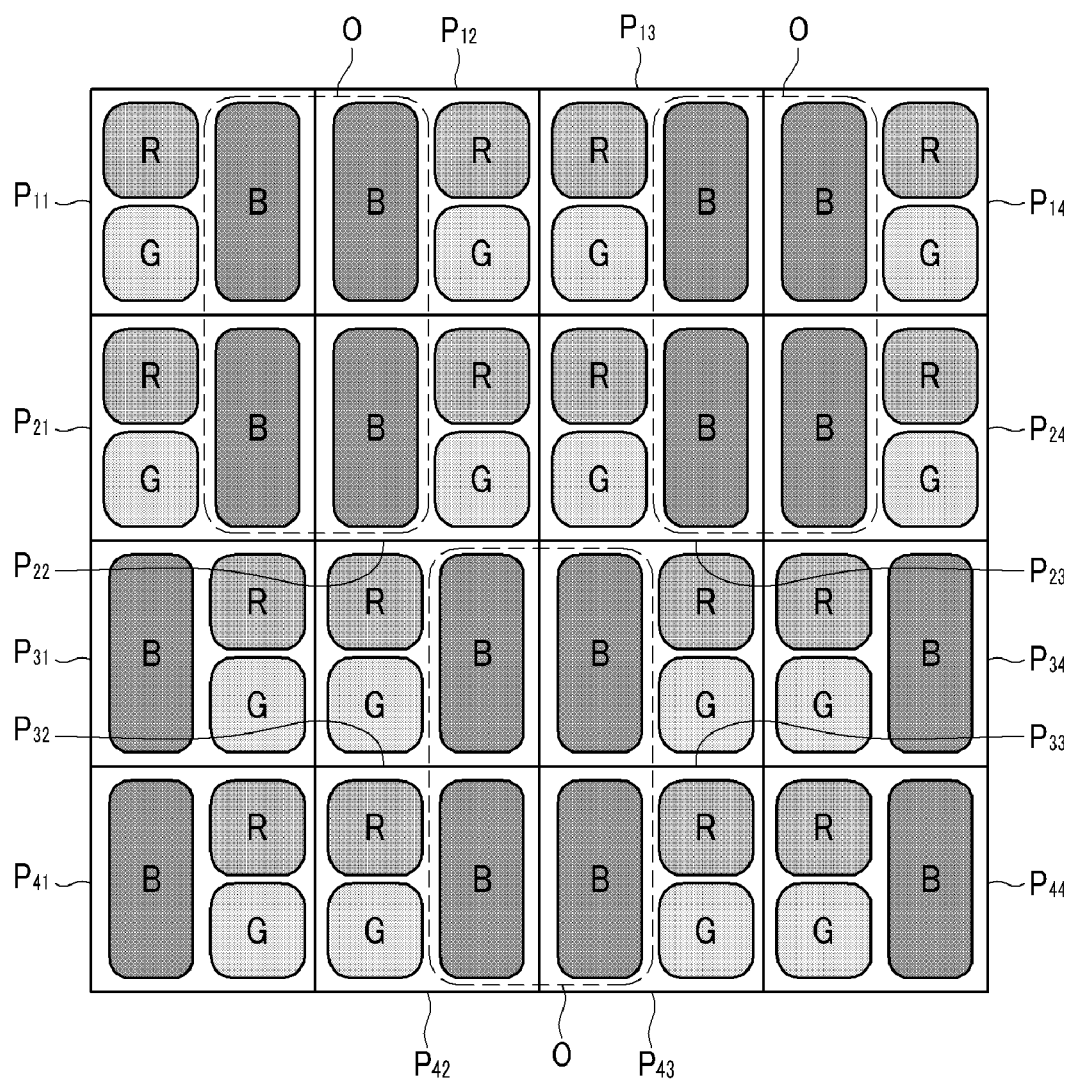

In FIG. 13, the unit pixel and the unit pixel of right and left symmetry are alternately arranged by two in the row direction, and are alternately arranged by one in the column direction. In the exemplary embodiment shown in FIG. 13, the emission layers 373 of a total of four neighboring unit pixels of the upper, lower, left, and right sides are formed together. That is, the red emission layer 373R and the green emission layer 373G of the pixel $P_{12}$, the pixel $P_{13}$, the pixel $P_{22}$, and the pixel $P_{23}$ are formed by one opening O of a shadow mask. Also, the blue emission layer 373B of the pixel P11, the pixel P12, the pixel P21, and the pixel P22 are formed together. The opening O of the shadow mask for forming the blue emission layer 373B is the same opening O of the shadow mask for forming the red emission layer 373R and the green emission layer 373G.

The exemplary embodiment shown in FIG. 13 includes the smaller region where the shadow effect is considered compared with the exemplary embodiment shown in FIG. 12, such that the aperture ratio may be improved.

Figure 14:
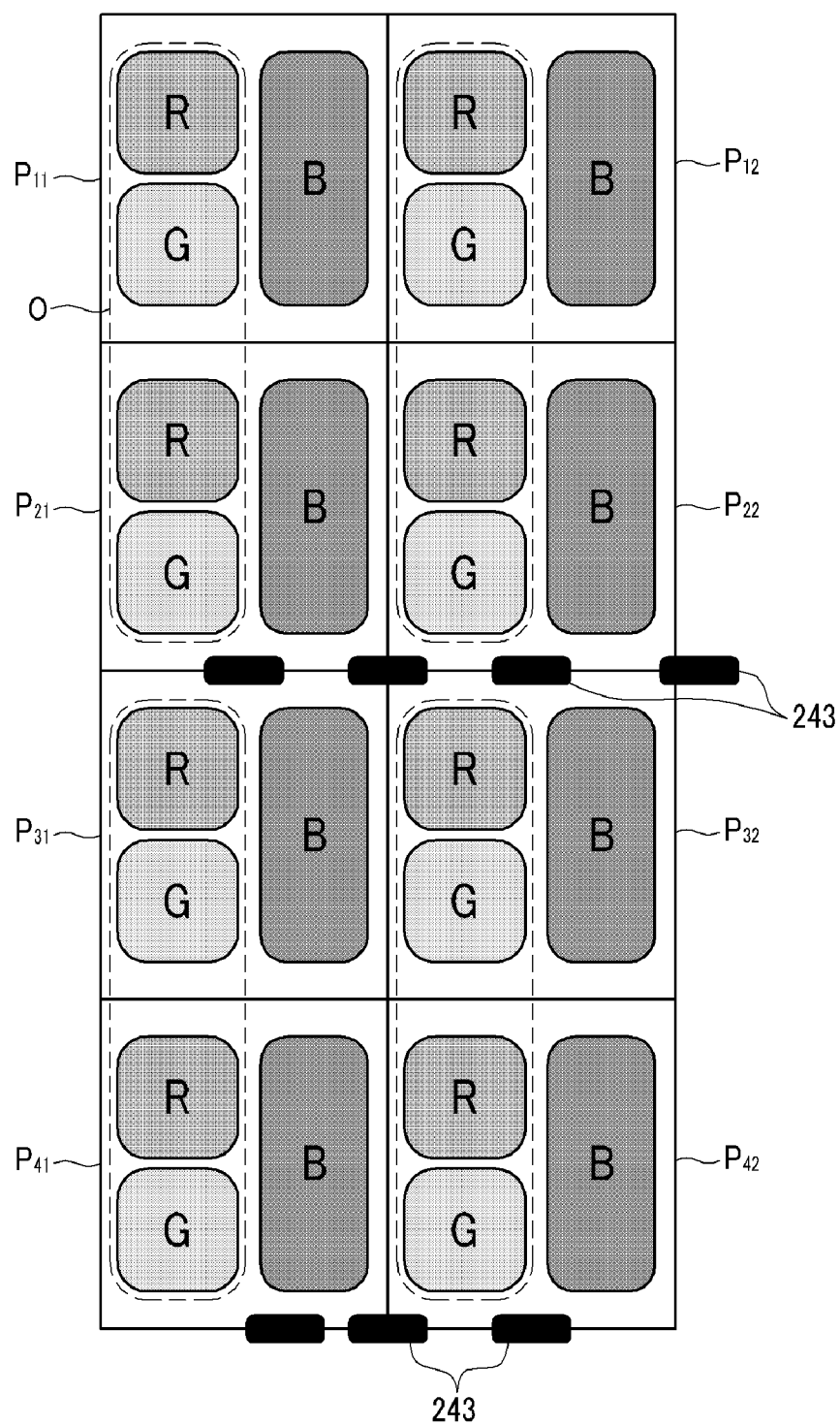
FIG. 14 is a schematic layout view of a unit pixel of an organic light emitting device according to another exemplary embodiment of the present invention.

FIG. 14 is a layout view of unit pixels in an organic light emitting device according to another exemplary embodiment of the present invention.

The exemplary embodiment shown in FIG. 14 includes the same arrangement of pixels as that shown in FIG. 10. However, a plurality of auxiliary electrodes 243 is included in FIG. 14. The auxiliary electrode 243 is an electrode for applying a predetermined voltage to the common electrode 270, and may be formed with the same layer as the gate line or the data line, or with an additional layer. The auxiliary electrodes 243 are disposed between the neighboring subpixels, however they are not disposed between the subpixels that are formed by the same opening O of the shadow mask. Rather, they are disposed between the subpixels that are formed using different openings O of the different shadow mask. In this way, the auxiliary electrodes 243 are formed in the region where the shadow effect is considered such that the reduction of the aperture ratio due to the auxiliary electrode 243 may be prevented.

Figure 15:
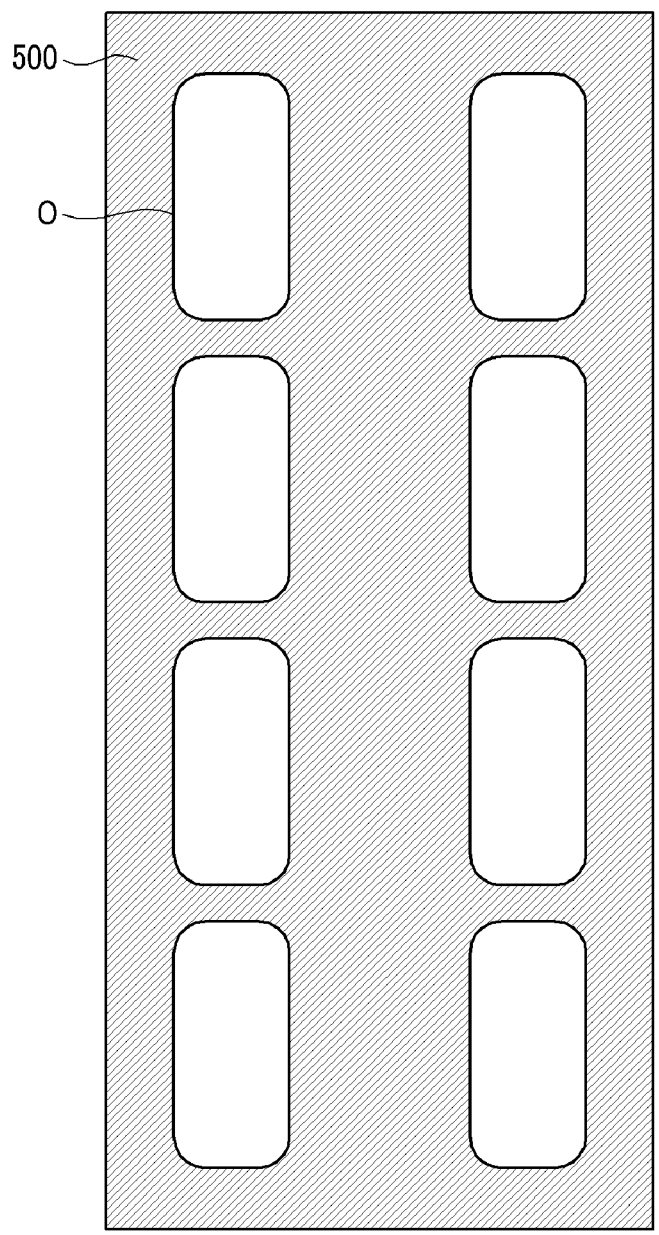
FIG. 15, FIG. 16, and FIG. 17 are views showing shadow masks for forming an emission layer of an organic light emitting member according to an exemplary embodiment of the present invention.
Figure 16:
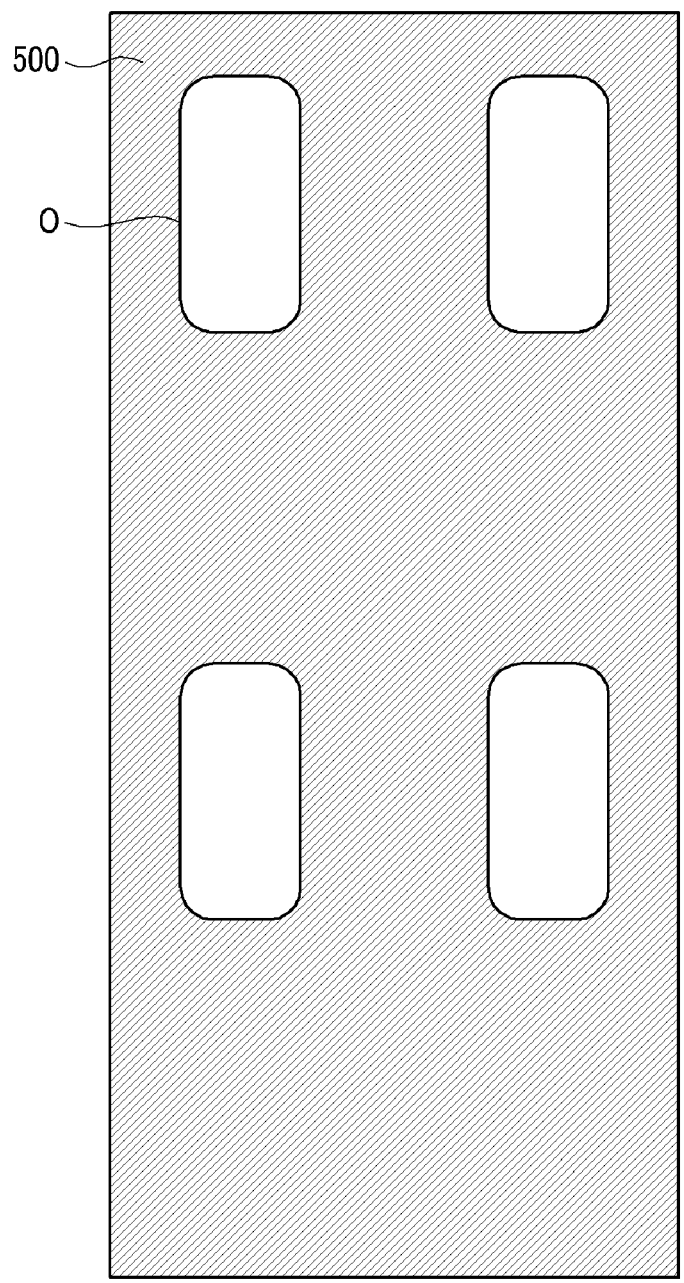
Figure 17:
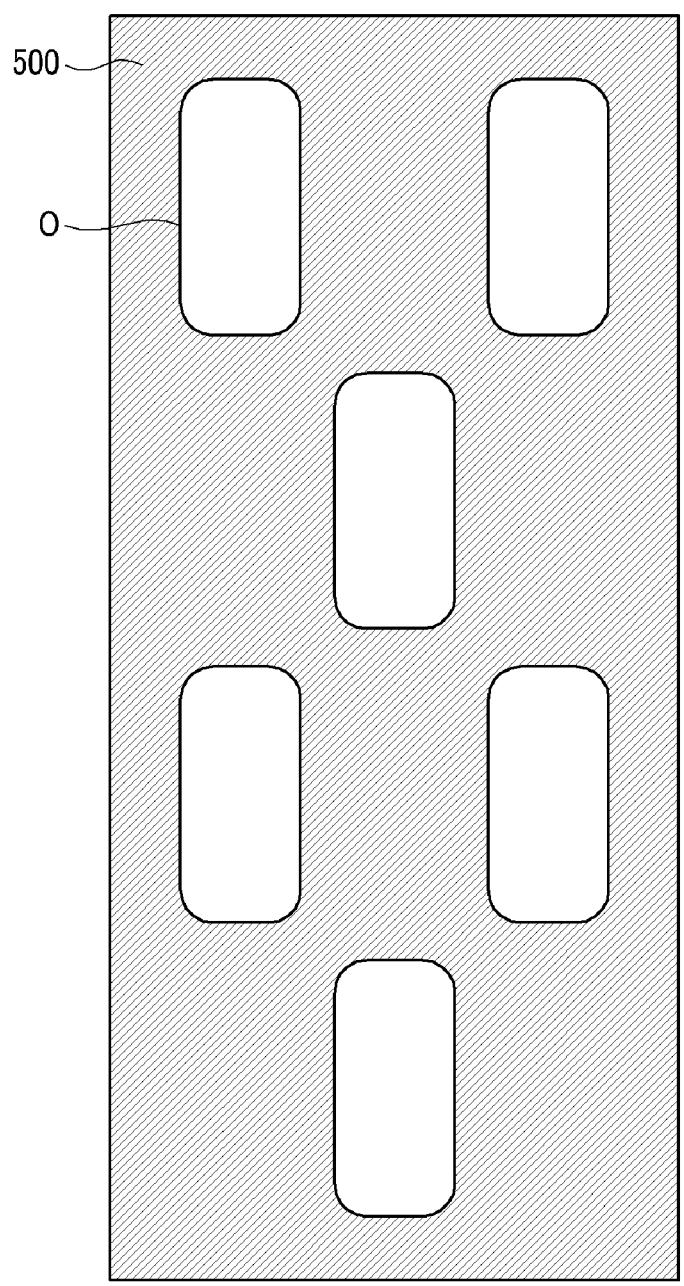

FIG. 15, FIG. 16, and FIG. 17 are views showing shadow masks for forming an emission layer of an organic light emitting member according to an exemplary embodiment of the present invention.

The opening O of the shadow mask is shown in FIG. 4, FIG. 10, FIG. 11, FIG. 12, FIG. 13, and FIG. 14, however a shadow mask for forming the emission layer will be described below.

A shadow mask 500 according to an exemplary embodiment of the present invention includes opening O having the same size and arranged in the row and column directions, and the openings O are arranged in the column direction in the exemplary embodiment shown in FIG. 15 and FIG. 16. However the openings O are arranged in the column direction with a zigzag shape in the exemplary embodiment shown in FIG. 17.

The shadow mask 500 according to an exemplary embodiment of the present invention has a merit that the red, green, and blue emission layers 373R, 373G, and 373B, respectively, may be formed through the openings O.

The exemplary embodiments shown in FIG. 4, FIG. 10, and FIG. 14 may use the shadow mask shown in FIG. 15 or FIG. 16. The size of the opening O changes according to the exemplary embodiment. The shadow mask of FIG. 16 is advantageous to improve the aperture ratio compared with the shadow mask of FIG. 15. In FIG. 16, the distance between the upper and lower two openings O may be limited to more than a predetermined distance. This may prevent a change of the exposure pattern due to the shadow effect. However, the distance between the openings O of the shadow mask is sufficient in FIG. 16 such that there may be a distance limit between the pixels or the subpixels, thereby improving the aperture ratio.

The exemplary embodiments shown in FIG. 11, FIG. 12, and FIG. 13 may use the shadow mask shown in FIG. 17.

The shadow mask shown in FIG. 15, FIG. 16, and FIG. 17 is used when forming the red emission layer 373R and the green emission layer 373G together, and also forming the blue emission layer 373B. Also, the size of the opening O changes according to the exemplary embodiment.

The present invention may be applied to an organic light emitting device having a different structure from the structure shown in FIG. 2 and FIG. 3. That is, a translucent electrode may be formed under the pixel electrode 191, and the common electrode 270 may be formed as a reflecting electrode to emit the light toward the lower side.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting device, comprising:
a first pixel comprising a first red subpixel, a first green subpixel, and a first blue subpixel, and
a second pixel comprising a second red subpixel, a second green subpixel, and a second blue subpixel,
wherein the first pixel and the second pixel are adjacent to each other in a column direction,
wherein the first green subpixel and the second blue subpixel are adjacent to each other in the column direction,
wherein the first blue subpixel and the second red subpixel are adjacent to each other in the column direction,
wherein the first and second red subpixels have substantially the same size and comprise a pixel electrode, a common electrode, and a red organic light emitting member, respectively,
wherein the first and second green subpixels have substantially the same size and comprise a pixel electrode, a common electrode, and a green organic light emitting member, respectively,
wherein the first and second blue subpixels have substantially the same size and comprise a pixel electrode, a common electrode, and a blue organic light emitting member, respectively,
wherein each of the first and second blue subpixels is continuous and undivided;
wherein the first red subpixel and the first green subpixel have substantially the same size,
wherein the first blue subpixel has substantially the same width as the first red subpixel and the first green subpixel,
wherein an area of the first blue subpixel is larger than a sum of an area of the first red subpixel and an area of the first green subpixel,
wherein the red organic light emitting member and the green organic light emitting member each have a different thickness from the blue organic light emitting member,
wherein the red organic light emitting member and the green organic light emitting member have substantially a same thickness, and wherein the pixel electrode of the first red subpixel has a different thickness from the pixel electrode of the first green subpixel.

2. The organic light emitting device of claim 1, wherein the first and second red subpixels, the first and second green subpixels, and the first and second blue subpixels further comprise a reflecting electrode arranged under the pixel electrode, and
an interval between the reflecting electrode and the common electrode in the first and second red subpixels is different from the interval between the reflecting electrode and the common electrode in the first and second green subpixels.

3. The organic light emitting device of claim 2, wherein:
the interval between the reflecting electrode and the common electrode in the first and second red subpixels is equivalent to a total thickness of the pixel electrode of the first and second red subpixels and the red organic light emitting member; and
the interval between the reflecting electrode and the common electrode in the first and second green subpixels is equivalent to a total thickness of the pixel electrode of the first and second green subpixel and the green organic light emitting member.

4. The organic light emitting device of claim 2, wherein the common electrode is a translucent electrode.

5. The organic light emitting device of claim 4, wherein the interval between the reflecting electrode and the common electrode is an integer multiple of the wavelength of the corresponding color of the corresponding subpixel.

6. The organic light emitting device of claim 4, wherein:
the reflecting electrode and the translucent electrode in each subpixel comprise a metal of magnesium, aluminum, silver, or an alloy thereof; and
the translucent electrode is thinner than the reflecting electrode.

7. The organic light emitting device of claim 1, wherein the blue organic light emitting member comprises a hole injection layer, a hole transport layer, a blue emission layer, an electron transport layer, and an electron injection layer that are sequentially disposed.

8. The organic light emitting device of claim 1, wherein the red organic light emitting member and the green organic light emitting member have substantially a same thickness as each other.

9. The organic light emitting device of claim 1, wherein the common electrode in each subpixel comprises aluminum.

10. The organic light emitting device of claim 1, wherein the pixel electrode of the first blue subpixel has substantially a same thickness as one of the pixel electrodes of the first red subpixel and the first green subpixel.

11. An organic light emitting device comprising:
a red subpixel comprising a pixel electrode, a common electrode, and a red organic light emitting member;
a green subpixel comprising a pixel electrode, a common electrode, and a green organic light emitting member; and
a blue subpixel comprising a pixel electrode, a common electrode, and a blue organic light emitting member, the blue subpixel having a larger size than the red subpixel, and the blue subpixel having a larger size than the green subpixel,
wherein:
one red subpixel, one green subpixel, and one blue subpixel form a unit pixel;
the blue subpixel is continuous and undivided;
the red subpixel and the green subpixel have substantially the same size;
the blue subpixel has substantially the same width as the red subpixel and the green subpixel;
an area of the blue subpixel is larger than a sum of an area of the red subpixel and an area of the green subpixel;
a first unit pixel comprises the red subpixel and the green subpixel, which are alternately arranged according to a first column, and the blue subpixel, which is arranged according to a second column;
a second unit pixel that is symmetrical in left and right directions; and
the red organic light emitting member and the green organic light emitting member each have a different thickness from the blue organic light emitting member,
wherein the red organic light emitting member and the green organic light emitting member have substantially a same thickness, and
wherein the pixel electrode of the red subpixel has a different thickness from the pixel electrode of the green subpixel.

12. The organic light emitting device of claim 11, wherein the red organic light emitting member and the green organic light emitting member have substantially a same thickness as each other.

13. The organic light emitting device of claim 11, wherein the common electrode in each subpixel comprises aluminum.

14. The organic light emitting device of claim 11, wherein the pixel electrode of the blue subpixel has substantially a same thickness as one of the pixel electrodes of the red subpixel and the green subpixel.

* * * * *